United States Patent
Chen et al.

(10) Patent No.: US 12,418,289 B1
(45) Date of Patent: Sep. 16, 2025

(54) HYBRID ANALOG KEY STRUCTURE

(71) Applicant: Logitech Europe S.A., Lausanne (CH)

(72) Inventors: Kuo Hsiang Chen, Toufen (TW);
Jérémie Willemin, Zhubei (TW);
Feng-Hao Lin, Hsinchu (TW)

(73) Assignee: Logitech Europe S.A., Lausanne (CH)

( * ) Notice: Subject to any disclaimer, the term of this patent is extended or adjusted under 35 U.S.C. 154(b) by 0 days.

(21) Appl. No.: 18/649,705

(22) Filed: Apr. 29, 2024

(51) Int. Cl.
*H03K 17/00* (2006.01)
*H03K 17/64* (2006.01)
*H03K 17/795* (2006.01)
*H03K 17/972* (2006.01)

(52) U.S. Cl.
CPC ......... *H03K 17/7955* (2013.01); *H03K 17/64* (2013.01); *H03K 17/972* (2013.01); *H01H 2221/04* (2013.01); *H03K 2217/94104* (2013.01)

(58) Field of Classification Search
CPC .... H03K 17/795; H03K 17/64; H03K 17/972; H03K 2217/94104; H03K 2217/960775
See application file for complete search history.

(56) References Cited

U.S. PATENT DOCUMENTS

| | | | | |
|---|---|---|---|---|
| 4,803,362 A | * | 2/1989 | Butts | H01H 13/50 250/229 |
| 10,469,081 B2 | * | 11/2019 | Hao | H03K 17/9638 |
| 11,150,741 B1 | * | 10/2021 | Stoeckli | G06F 3/0202 |

* cited by examiner

*Primary Examiner* — Tuan T Lam
(74) *Attorney, Agent, or Firm* — Kilpatrick Townsend & Stockton LLP

(57) ABSTRACT

A keyboard key structure comprising a key stem, a contact-based mechanical trigger, and a contactless analog key switch. The key stem is configured to be depressed and move along a linear path over a range of operation. The contact-based mechanical trigger is configured to activate after the key stem is depressed a threshold distance in the range of operation. In response to the contact-based mechanical trigger activating, the contactless analog key switch is configured to detect, at a sample rate, a position of the key stem between the threshold distance and an end of the range of operation after the key stem is depressed. The contact-based mechanical trigger can be a galvanic-type key switch. The contactless analog key switch can be one of an optical key switch, a magnetic key switch, or an inductive key switch.

20 Claims, 9 Drawing Sheets

HYBRID ANALOG KEY STRUCTURE

BACKGROUND

Computer peripheral devices are commonplace in modern society and are typically used to convert human-induced analog inputs (e.g., touches, clicks, motions, touch gestures, button presses, scroll wheel rotations, etc.) made in conjunction with a computer peripheral devices into digital signals for computer processing. A computer peripheral device, or more broadly, an input device, can include any device that can provide data and control signals to a computing system. Some non-limiting examples of input devices include computer mice, keyboards, virtual reality and/or augmented reality controllers, touch pads, remote controls, gaming controllers, joysticks, trackballs, and the like.

Input devices have undergone many marked improvements over the last several decades. In some contemporary input devices, such as keyboards, analog keys have become popular for certain applications like e-sports. Analog keys can provide better resolution in key press detection that extends beyond a simple make or break connection, but may require a significant increase in power requirements, which can be problematic for wireless devices with limited power reserves. As such, better solutions are needed.

Unless otherwise indicated herein, the materials described in this section are not prior art to the claims in this application and are not admitted as being prior art by inclusion in this section.

BRIEF SUMMARY

In some embodiments, a keyboard key structure comprises a key stem, a contact-based mechanical trigger, and a contactless analog key switch. The key stem can be configured to be depressed and move along a linear path over a range of operation, wherein the contact-based mechanical trigger is configured to activate after the key stem is depressed a threshold distance in the range of operation, and in response to the contact-based mechanical trigger activating, the contactless analog key switch is configured to detect, at a sample rate, a position of the key stem between the threshold distance and an end of the range of operation. In some embodiments, a maximum range of operation of the key stem is between 3-6 mm, and the threshold distance that activates the contact-based mechanical trigger is between 0-1 mm, although other ranges are possible. The contact-based mechanical trigger can be a galvanic-type key switch. The contactless analog key switch can be one of an optical analog key switch, a magnetic analog key switch, an inductive analog key switch, or the like, as would be appreciated by one of ordinary skill in the art with the benefit of this disclosure.

In some cases, the optical analog key switch includes a phototransistor, a light emitting element operable to direct light towards the phototransistor in response to the activation of the contact-based mechanical trigger, and a blocking device coupled to the key stem configured to move along the linear path with the key stem and control an amount of light that reaches the phototransistor from the light emitting element based on a position of the blocking device in the range of operation. The optical analog key switch can detect the position of the key stem based on the controlled amount of light that reaches the phototransistor. The inductive analog key switch can include a conductive target coupled to the key stem and configured to move with the key stem along the linear path over at least a portion of the range of operation and one or more inductive coils configured to detect the conductive target and generate a corresponding signal, where the inductive analog key switch detects the position of the key stem based on a strength of the corresponding signal.

In some embodiments, the sample rate is a first sample rate, wherein the contactless analog key switch is configured to detect the position of the key stem at a second sample rate at a second threshold distance, wherein the second threshold distance is between the threshold distance and the end of the range of operation, and wherein the second sample rate is faster than the first sample rate. In certain embodiments, when the detected position of the key stem is at or below the threshold distance and above the second threshold distance for a threshold time, the keyboard key structure stops detecting the position of the key stem. In some cases, the second threshold distance can be user programmable, and when the second threshold distance is programmed to be within 1 mm of the threshold distance (or any suitable distance), the contactless analog key switch operates independent of and not in response to the contact-based mechanical trigger activating. The contact-based mechanical trigger can be configured to provide a haptic feedback when the threshold distance is reached independent of the operation of the contactless analog key switch. When the detected position of the key stem is above the threshold distance, the keyboard key structure may be configured to stop detecting the position of the key stem.

In certain embodiments, a method of operating a keyboard comprises: receiving a signal from a contact-based mechanical trigger of a hybrid key structure comprising the contact-based key mechanical trigger and a contactless analog key switch, the signal indicating that the contact-based mechanical trigger is activated due to a key stem of the hybrid key structure being depressed over a range of operation by a threshold distance; and in response to the contact-based mechanical trigger activating, detecting, by the contactless analog key switch at a sample rate, a position of the key stem between the threshold distance and an end of the range of operation; and in response to the contact-based mechanical trigger deactivating due to the key stem moving below the threshold distance, ceasing detection of the position of the key stem over the range of operation. In some cases, a maximum range of operation of the key stem is between 3-6 mm, and the threshold distance that activates the contact-based mechanical trigger is between 0-1 mm, although other ranges can be used.

In some embodiments, the contact-based mechanical trigger is a galvanic-type key switch and the contactless analog key switch is one of an optical analog key switch, a magnetic analog key switch, or an inductive analog key switch. The optical analog key switch may include a phototransistor, a light emitting element operable to direct light towards the phototransistor in response to the activation of the contact-based mechanical trigger, and a blocking device coupled to the key stem configured to move along a linear path with the key stem and control an amount of light that reaches the phototransistor from the light emitting element based on a position of the blocking device in the range of operation, wherein the optical analog key switch detects the position of the key stem based on the controlled amount of light that reaches the phototransistor. In some cases, the inductive analog key switch includes a conductive target coupled to the key stem and configured to move with the key stem along a linear path over at least a portion of the range of operation, and one or more inductive coils configured to detect the conductive target and generate a corresponding signal, wherein the inductive analog key switch detects the position of the key stem based on a strength of the corresponding signal. In certain embodiments, the sample rate is a first sample rate, wherein the contactless analog key switch is configured to detect the position of the key stem at a second sample rate at a second threshold distance, wherein the second threshold distance is between the threshold distance and the end of the range of operation, and wherein the second sample rate is faster than the first sample rate. In some cases, the second threshold distance is user programmable, and wherein when the second threshold distance is programmed to be within 1 mm of the threshold distance, the contactless analog key switch operates independent of and not in response to the contact-based mechanical trigger activating.

In further embodiments, a keyboard key structure comprises a key stem, a contact-based key switch, and a contactless analog key switch, wherein the key stem is configured to be depressed, wherein the contact-based mechanical trigger is configured to activate first as the key stem is depressed, and wherein in response to the contact-based key switch activating, and after the key stem is depressed a further distance, the contactless analog key switch is activated and operable to detect, at a sample rate, a position of the key stem over a range of operation.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention will be more apparent from the following detailed description taken in conjunction with the accompanying drawings, in which.

Throughout the drawings, it should be noted that like reference numbers are typically used to depict the same or similar elements, features, and structures.

DETAILED DESCRIPTION

Aspects of the present disclosure relate generally to computer peripheral devices, and more particularly to keyed input devices (e.g., keyboards), according to certain embodiments.

In the following description, various examples of computer peripheral devices with hybrid analog key structures are described. For purposes of explanation, specific configurations and details are set forth to provide a thorough understanding of the embodiments. However, it will be apparent to one skilled in the art that certain embodiments may be practiced or implemented without every detail disclosed. Furthermore, well-known features may be omitted or simplified to prevent any obfuscation of the novel features described herein.

The following high-level summary is intended to provide a basic understanding of some of the novel innovations depicted in the figures and presented in the corresponding descriptions provided below. Aspects of the invention relate to a keyboard with one or key structures having a hybrid analog switch architecture that can provide analog precision for key presses in a power efficient manner. In some embodiments, a hybrid key switch can include a first contact-based or mechanical switch (e.g., galvanic) to provide a first threshold where a key press is instantiated, and a second contactless switch (e.g., magnetic, optical, inductive) for analog detection where they system can determine how much the key is pressed with high precision over a range of motion, as shown and described, e.g., in FIGS. 8-9, rather than binary on/off detection of contemporary devices. Upon release of the key (e.g., with 1 μs), or when the key moves up beyond a second threshold value that may be the same or different position than the first threshold value, the analog function turns off, resulting is significant power savings over contemporary counterparts that have continuous analog key functions that may not be practicable with keyboards having power limitations, such as battery powered wireless devices. Although keyboards that incorporate the novel aspects described throughout the present disclosure, it would be understood by those of ordinary skill in the art with the benefit of this disclosure that the novel hybrid analog switch concepts presented herein can be applied to any suitable computer peripheral device.

It is to be understood that this high-level summary is presented to provide the reader with a baseline understanding of some of the novel aspects of the present disclosure and a roadmap to the details that follow. This high-level summary in no way limits the scope of the various embodiments described throughout the detailed description and each of the figures referenced above are further described below in greater detail and in their proper scope.

Figure 1:
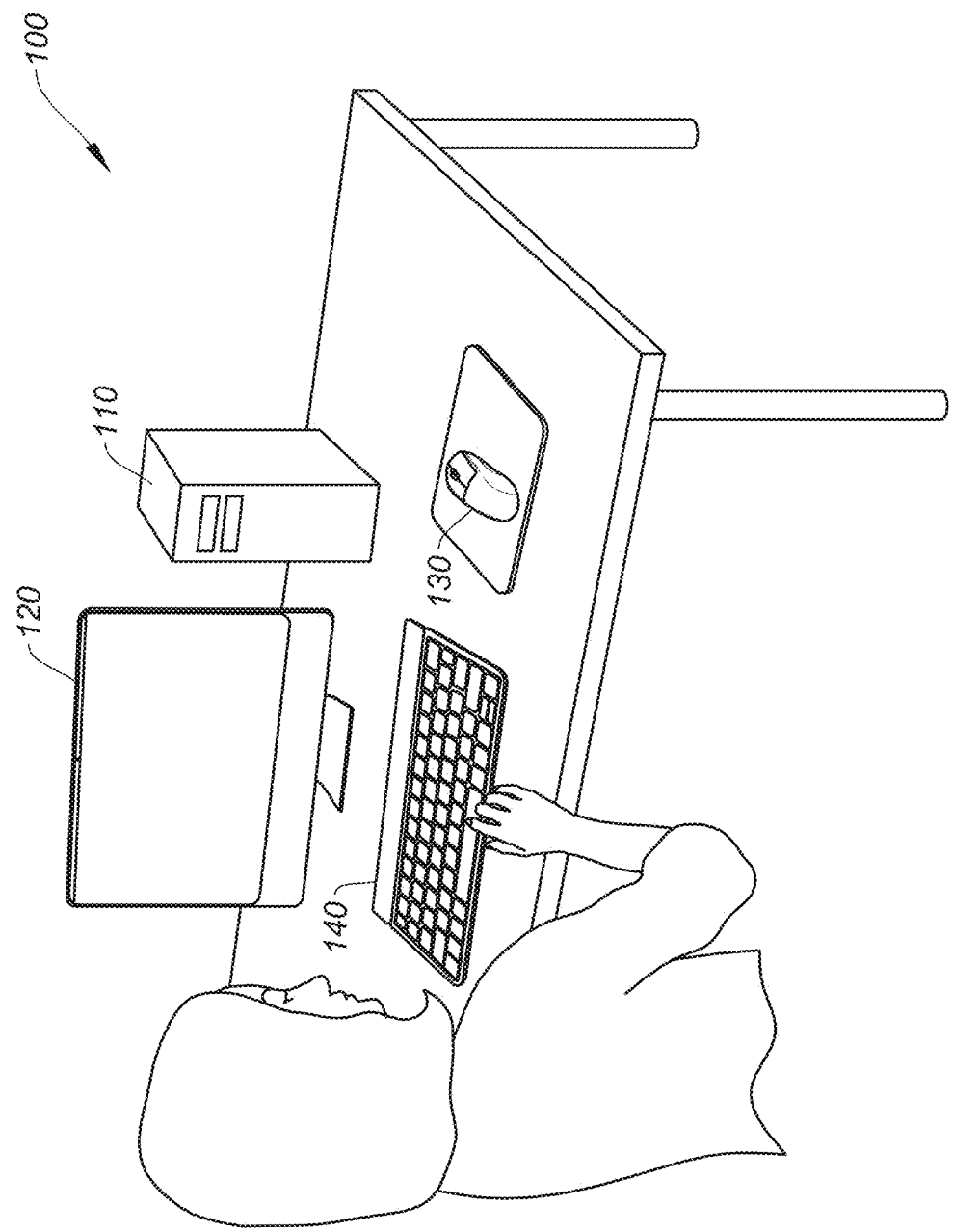
FIG. 1 shows a simplified example of a computer system that can include any of a variety of host computing devices and computer peripheral devices, including computer peripheral devices that can be configured to perform aspects of the various inventive concepts described herein.

FIG. 1 shows a simplified example of a computer system 100 that can include any of a variety of host computing devices and computer peripheral devices, including computer peripheral devices (e.g., a computer mouse, keyboard, etc.) that can be configured to perform aspects of the various inventive concepts described herein. Computer system 100 can include computer 110, monitor 120, computer mouse 130, and keyboard 140. In some cases, keyboard 140 can be a "qwerty" style keyboard, or any suitable input device (e.g., internet-of-things device, AR/VR controller, remote controller, or the like) with one or more keys that can be configured as hybrid analog keys, as further described throughout this disclosure. For computer system 100, keyboard 140 can be configured to control various aspects of computer 110 and monitor 120, as would be appreciated by one of ordinary skill in the art with the benefit of this disclosure. The monitor 120, computer mouse 130, and keyboard 140 may be referred to generally as "computer peripheral devices" or "input devices." Computer peripheral devices 120-140 can be communicatively coupled to host computing device 110 and, in some cases, may be coupled to multiple host computing devices. Although many of the examples presented herein utilize hybrid analog key structures in a keyboard-type computer peripheral device, it would be understood by those of ordinary skill in the art with the benefit of this disclosure that the usage of such structures can be applied to other types of input devices.

Computer 110 can be any suitable computing device including, but not limited to, a desktop computer, a laptop computer, a tablet or "phablet" computer, a smart phone, a PDA, a wearable device (e.g., smart watches, smart glasses), virtual reality/augmented reality (AR/VR) system, or the like. A host computing device may also be referred to herein as a "host computer," "host device," "computing device," "computer," or the like, and may include a machine-readable medium (not shown) configured to store computer code, such as driver software, firmware, and the like, where the computer code may be executable by one or more processors of the host computing device(s) (see, e.g., processor 210 of FIG. 2) to control aspects of the host computing device, for instance, via the one or more computer peripheral devices.

Figure 2:
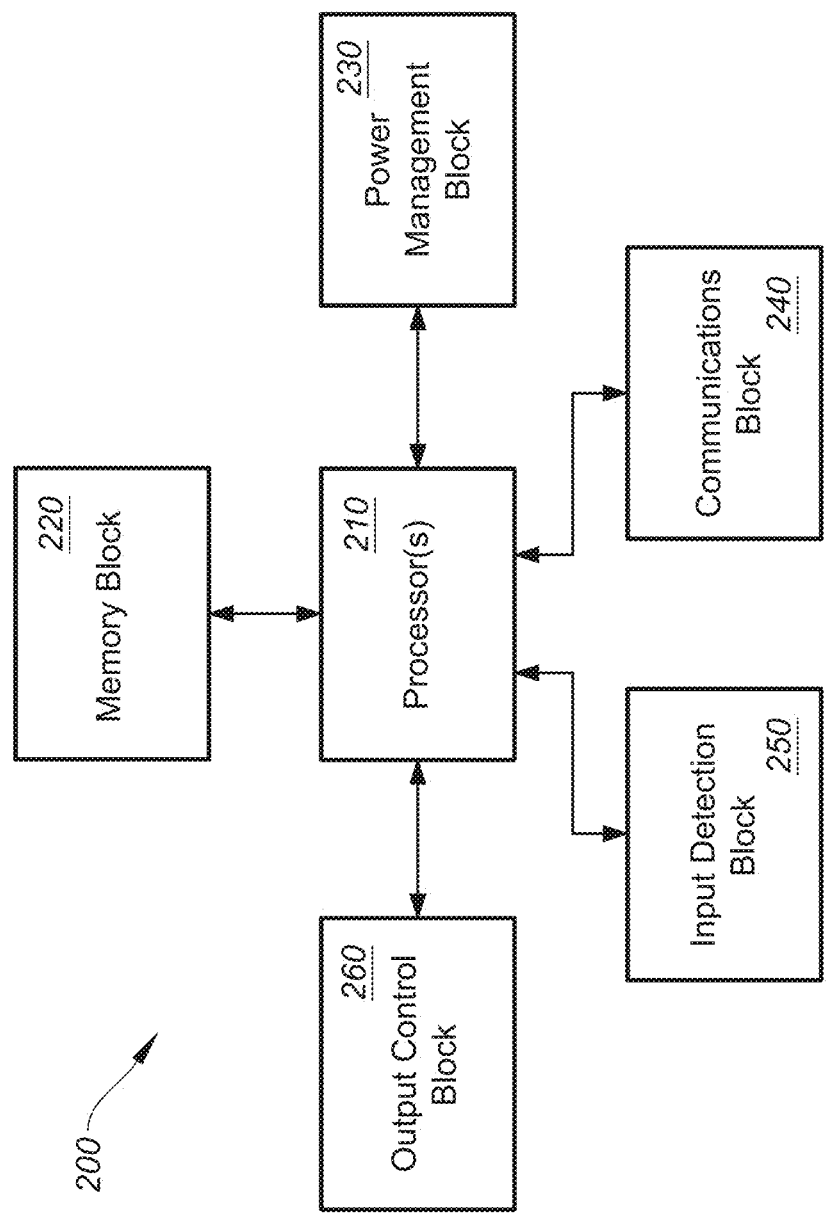
FIG. 2 shows a system for operating a computer peripheral device, according to certain embodiments.

FIG. 2 shows a system 200 for operating a computer peripheral device (e.g., computer mouse 130, keyboard 140, etc.), according to certain embodiments. System 200 may be configured to operate any of the computer peripheral devices shown or not shown herein but within the wide purview of the present disclosure. System 200 may include processor(s) 210, memory 220, a power management system 230, a communication module 240, an input detection module 250, and an output control module 260. Each of the system blocks 220-260 can be in electronic communication with processor (s) 210 (e.g., via a bus system). System 200 may include additional functional blocks that are not shown or discussed to prevent obfuscation of the novel features described herein. System blocks 220-260 (also referred to as "modules") may be implemented as separate blocks, or alternatively, more than one system block may be implemented in a single block. In the context described herein, system 200 can be incorporated into any computer peripheral devices (e.g., input devices) described or mentioned herein and may be further configured with any of the hybrid analog key structures presented herein, as would be appreciated by one of ordinary skill in the art with the benefit of this disclosure.

In certain embodiments, processor(s) 210 may include one or more microprocessors and can be configured to control the operation of system 200. Alternatively or additionally, processor(s) 210 may include one or more microcontrollers (MCUs), digital signal processors (DSPs), or the like, with supporting hardware and/or firmware (e.g., memory, programmable I/Os, etc.), and/or software, as would be appreciated by one of ordinary skill in the art. Processor(s) 210 can control some or all aspects of the operation of keyboard 140 (e.g., system blocks 220-260). Alternatively or additionally, some of system blocks 220-260 may include an additional dedicated processor, which may work in conjunction with processor(s) 210. For instance, MCUs, µCs, DSPs, and the like, may be configured in other system blocks of system 200. Communications block 240 may include a local processor, for instance, to control aspects of communication with host computer 110 (e.g., via Bluetooth, Bluetooth LE, RF, IR, hardwire, ZigBee, Z-Wave, Logitech Unifying, or other communication protocol). Processor(s) 210 may be local to the computer peripheral device (e.g., contained therein), may be external to the computer peripheral device (e.g., off-board processing, such as by a corresponding host computing device), or a combination thereof. Processor(s) 210 may perform any of the various functions and methods described and/or covered by this disclosure in conjunction with any other system blocks in system 200. In some implementations, processor 302 of FIG. 3 may work in conjunction with processor 210 to perform some or all of the various methods described throughout this disclosure. In some embodiments, multiple processors may enable increased performance characteristics in system 200 (e.g., speed and bandwidth), however multiple processors are not required, nor necessarily germane to the novelty of the embodiments described herein. One of ordinary skill in the art would understand the many variations, modifications, and alternative embodiments that are possible.

Memory block ("memory") 220 can store one or more software programs to be executed by one or more processors (e.g., processor(s) 210). It should be understood that "software" can refer to sequences of instructions that, when executed by processing unit(s) (e.g., processors, processing devices, etc.), cause system 200 to perform certain operations of software programs. The instructions can be stored as firmware residing in read-only memory (ROM), and/or applications stored in media storage that can be read into memory for execution by processing devices (e.g., processor (s) 210). Software can be implemented as a single program or a collection of separate programs and can be stored in non-volatile storage and copied in whole or in-part to volatile working memory during program execution. In some embodiments, memory 220 may store data corresponding to inputs on the computer peripheral device, such as a detected movement of the computer peripheral device, a sensor (e.g., optical sensor, accelerometer, etc.), activation of one or more input elements (e.g., buttons, sliders, touch-sensitive regions, etc.), or the like. Stored data may be aggregated and sent via reports to a host computing device.

In certain embodiments, memory 220 can store the various data described throughout this disclosure. Memory 220 can be used to store any suitable data to perform any function described herein and as would be appreciated by one of ordinary skill in the art with the benefit of this disclosure. Memory 220 can be referred to as a storage system or storage subsystem and can store one or more software programs to be executed by processors (e.g., in processor(s) 210). It should be understood that "software" can refer to sequences of instructions that, when executed by processing unit(s) (e.g., processors, processing devices, etc.), cause system 200 to perform certain operations of software programs. The instructions can be stored as firmware residing in read only memory (ROM) and/or applications stored in media storage that can be read into memory for processing by processing devices. Software can be implemented as a single program or a collection of separate programs and can be stored in non-volatile storage and copied in whole or in-part to volatile working memory during program execution. From a storage subsystem, processing devices can retrieve program instructions to execute to execute various operations (e.g., software-controlled switches, etc.) as described herein.

Power management system 230 can be configured to manage power distribution, recharging, power efficiency, and the like. In some embodiments, power management system 230 can include a battery (not shown), a Universal Serial Bus (USB)-based recharging system for the battery (not shown), and power management devices (e.g., voltage regulators—not shown), and a power grid within system 200 to provide power to each subsystem (e.g., communications block 240, etc.). In certain embodiments, the functions provided by power management system 230 may be incorporated into processor(s) 210. Alternatively, some embodiments may not include a dedicated power management block. For example, functional aspects of power management block 240 may be subsumed by another block (e.g., processor(s) 210) or in combination therewith. The power source can be a replaceable battery, a rechargeable energy storage device (e.g., super capacitor, Lithium Polymer Battery, NiMH, NiCd), or a corded power supply. The recharging system can be an additional cable (specific for the recharging purpose), or it can use a USB connection to recharge the battery.

Communication system 240 can be configured to enable wireless communication with a corresponding host computing device (e.g., 110), or other devices and/or computer peripherals, according to certain embodiments. Communication system 240 can be configured to provide radiofrequency (RF), Near-Field Communication (NFC), Bluetooth®, Logitech proprietary communication protocol (e.g., Unifying, Gaming Lightspeed, or others), infra-red (IR), ZigBee®, Z-Wave, or other suitable communication technology to communicate with other computing devices and/or peripheral devices. System 200 may optionally comprise a hardwired connection to the corresponding host computing device. For example, computer peripheral device 140 can be configured to receive a USB, FireWire®, Thunderbolt®, or other universal-type cable to enable bi-directional electronic communication with the corresponding host computing device or other external devices. Some embodiments may utilize different types of cables or connection protocol standards to establish hardwired communication with other entities. In some aspects, communication ports (e.g., USB), power ports, etc., may be considered as part of other blocks described herein (e.g., input detection module 250, output control module 260, etc.). In some aspects, communication system 240 can send reports generated by the processor(s) 210 (e.g., HID data, streaming or aggregated data, etc.) to a host computing device. In some cases, the reports can be generated by the processor(s) only, in conjunction with the processor(s), or other entity in system 200. Communication system 240 may incorporate one or more antennas, oscillators, etc., and may operate at any suitable frequency band (e.g., 2.4 GHZ), etc. One of ordinary skill in the art with the benefit of this disclosure would appreciate the many modifications, variations, and alternative embodiments thereof.

Input detection module 250 can control the detection of a user-interaction with input elements on an input device. For instance, input detection module 250 can detect user inputs from motion sensors, keys, or buttons (e.g., depressible elements), roller wheels, scroll wheels, track balls, touch pads (e.g., one and/or two-dimensional touch sensitive touch pads), click wheels, dials, keypads, microphones, GUIs, touch-sensitive GUIs, proximity sensors (e.g., IR, thermal, Hall effect, inductive sensing, etc.), an image sensor based detection such as gesture detection (e.g., via webcam), audio based detection such as voice input (e.g., via microphone), or the like, as would be appreciated by one of ordinary skill in the art with the benefit of this disclosure. Alternatively, the functions of input detection module 250 or subset thereof can be subsumed by processor 210, or in combination therewith.

In some embodiments, input detection module 250 can detect a touch or touch gesture on one or more touch sensitive surfaces on keyboard 140. Input detection block 250 can include one or more touch sensitive surfaces or touch sensors. Touch sensors generally comprise sensing elements suitable to detect a signal such as direct contact, electromagnetic or electrostatic fields, or a beam of electromagnetic radiation. Touch sensors can typically detect changes in a received signal, the presence of a signal, or the absence of a signal. A touch sensor may include a source for emitting the detected signal, or the signal may be generated by a secondary source. Touch sensors may be configured to detect the presence of an object at a distance from a reference zone or point (e.g., <5 mm), contact with a reference zone or point, or a combination thereof. Certain embodiments of computer peripheral device 140 may or may not utilize touch detection or touch sensing capabilities.

Input detection block 250 can include touch and/or proximity sensing capabilities. Some examples of the types of touch/proximity sensors may include, but are not limited to, resistive sensors (e.g., air-gap 4-wire based, based on carbon loaded plastics which have different electrical characteristics depending on the pressure (FSR), interpolated FSR, strain gages, etc.), capacitive sensors (e.g., surface capacitance, self-capacitance, mutual capacitance, etc.), optical sensors (e.g., light barrier type (default open or closed), infrared light barriers matrix, laser based diode coupled with photodetectors that could measure the time of flight of the light path, etc.), acoustic sensors (e.g., piezo-buzzer coupled with microphones to detect the modification of a wave propagation pattern related to touch points, etc.), inductive sensors, magnetic sensors (e.g., Hall Effect, etc.), or the like.

Input detection module 250 may include a movement tracking sub-block that can be configured to detect a relative displacement (movement tracking) of a computer peripheral device. For example, input detection module 250 optical sensor(s) such as IR LEDs and an imaging array of photodiodes to detect a movement of a computer peripheral device relative to an underlying surface. A computer peripheral device may optionally include movement tracking hardware that utilizes coherent (laser) light. Moving tracking can provide positional data (e.g., delta X and delta Y data from last sampling) or lift detection data. For example, an optical sensor can detect when a user lifts the computer peripheral device (e.g., computer mouse 130) off of an underlying surface (also referred to as a "work surface") and can send that data to processor 210 for further processing. In some embodiments, processor 210, the movement tracking block (which may include an additional dedicated processor), or a combination thereof, as would be appreciated by one of ordinary skill in the art with the benefit of this disclosure.

In certain embodiments, accelerometers can be used for movement detection. Accelerometers can be electromechanical devices (e.g., micro-electromechanical systems (MEMS) devices) configured to measure acceleration forces (e.g., static and dynamic forces). One or more accelerometers can be used to detect three-dimensional (3D) positioning. For example, 3D tracking can utilize a three-axis accelerometer or two two-axis accelerometers (e.g., in a "3D air mouse," HMD, or another device). Accelerometers can further determine if the computer peripheral device has been lifted off of an underlying surface and can provide movement data that may include the velocity, physical orientation, and acceleration of a computer peripheral device. In some embodiments, gyroscope(s) can be used in lieu of or in conjunction with accelerometer(s) to determine movement or input device orientation.

In some embodiments, input detection block 250 can control aspects of one or more sensing elements, as described herein. For example, input detection block 250 can control a sensing element including a first sensing section configured to detect movement of a depressible plunger (e.g., with key cap) along the first range of motion and generate corresponding first data. Some embodiments may include a second sensing section configured to detect movement of the depressible plunger along the second range of motion and generate corresponding second data, where processor(s) 210 may be configured to determine a position of the plunger (e.g., target coupled to the plunger) along the first range of motion based on the first data and, in some cases, determine a force produced by the plunger, while the plunger moves along the second range of motion, based on the second data.

In some embodiments, output control module 260 can control various outputs for a corresponding computer peripheral device. For instance, output control module 260 may control a number of visual output elements (e.g., LEDs, LCD or LED screens/keys), displays, audio outputs (e.g., speakers), haptic output systems, or the like. One of ordinary skill in the art with the benefit of this disclosure would appreciate the many modifications, variations, and alternative embodiments thereof.

Although certain systems may not be expressly discussed, they should be considered as part of system 200, as would be understood by one of ordinary skill in the art. For example, system 200 may include a bus system to transfer power and/or data to and from the different systems therein. It should be appreciated that system 200 is illustrative and that variations and modifications are possible. System 200 can have other capabilities not specifically described herein. Further, while system 200 is described with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained.

Embodiments of the present invention can be realized in a variety of apparatuses including electronic devices (e.g., computer peripheral devices) implemented using any combination of circuitry and software. Furthermore, aspects and/or portions of system 200 may be combined with or operated by other sub-systems as required by design. For example, input detection module 250 and/or memory 220 may operate within processor(s) 210 instead of functioning as separate entities. In addition, the inventive concepts described herein can also be applied to any electronic device. Further, system 200 can be applied to any of the computer peripheral devices described in the embodiments herein, whether explicitly, referentially, or tacitly described (e.g., would have been known to be applicable to a particular computer peripheral device by one of ordinary skill in the art). The foregoing embodiments are not intended to be limiting and those of ordinary skill in the art with the benefit of this disclosure would appreciate the myriad applications and possibilities.

Figure 3:
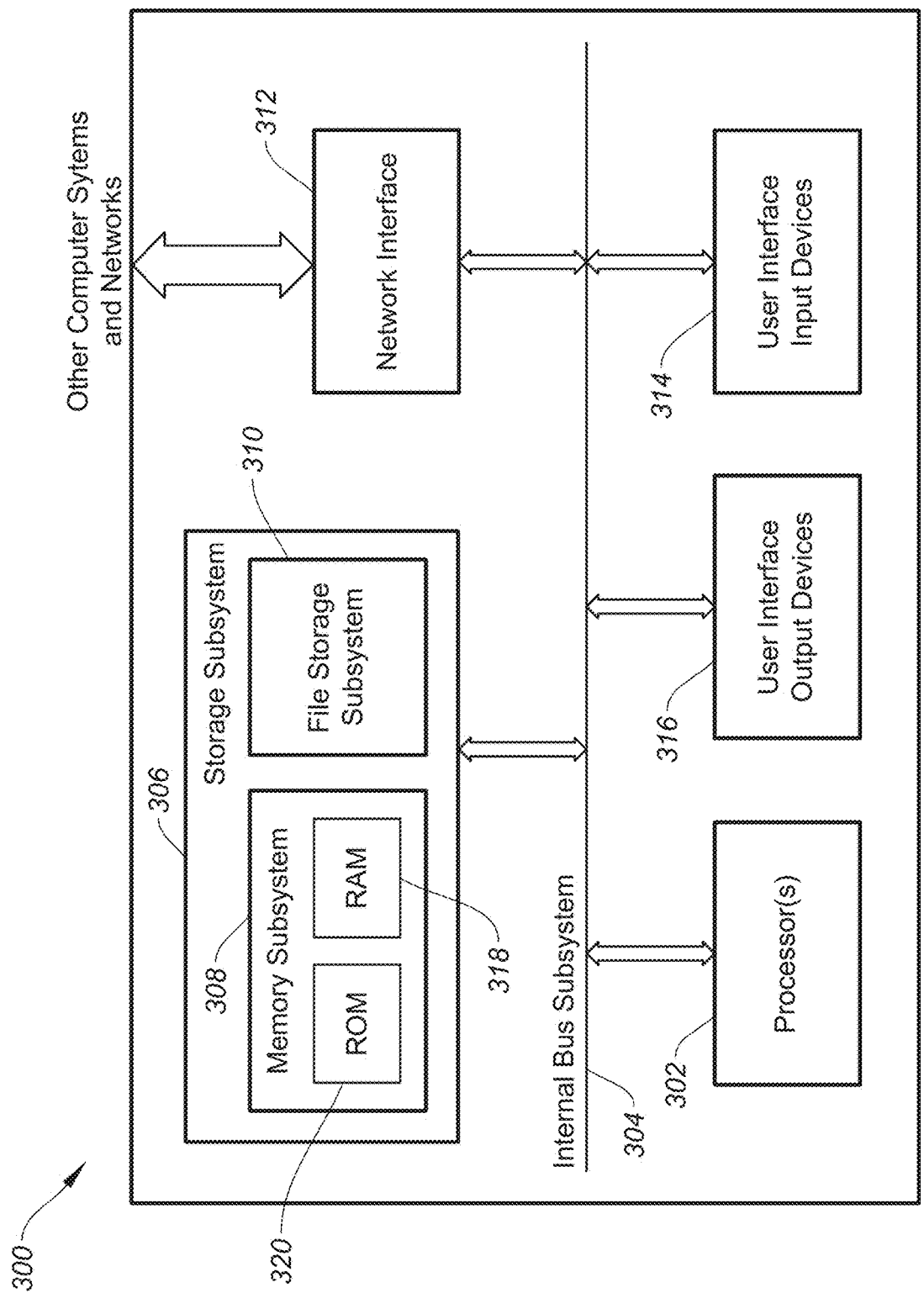
FIG. 3 is a simplified block diagram of a host computing device, according to certain embodiments.

FIG. 3 is a simplified block diagram of a host computing device 300, according to certain embodiments. Host computing device 300 can implement some or all functions, behaviors, and/or capabilities described herein that would use electronic storage or processing, as well as other functions, behaviors, or capabilities not expressly described. Host computing device 300 can include a processing subsystem (processor(s)) 302, a storage subsystem 306, user interfaces 314, 316, and a communication interface 312. Computing device 300 can also include other components (not explicitly shown) such as a battery, power controllers, and other components operable to provide various enhanced capabilities. In various embodiments, host computing device 300 can be implemented in any suitable computing device, such as a desktop or laptop computer (e.g., desktop 110), mobile device (e.g., tablet computer, smart phone, mobile phone), wearable device, media device, or the like, or in peripheral devices (e.g., keyboards, etc.) in certain implementations.

Processor(s) 302 can include MCU(s), micro-processors, application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, or electronic units designed to perform a function, portions of functions, or a combination of methods, functions, etc., described throughout this disclosure.

Storage subsystem 306 can be implemented using a local storage and/or removable storage medium, e.g., using disk, flash memory (e.g., secure digital card, universal serial bus flash drive), or any other non-transitory storage medium, or a combination of media, and can include volatile and/or non-volatile storage media. Local storage can include a memory subsystem 308 including random access memory (RAM) 318 such as dynamic RAM (DRAM), static RAM (SRAM), synchronous dynamic RAM (e.g., DDR), or battery backed up RAM or read-only memory (ROM) 320, or a file storage subsystem 310 that may include one or more code modules. In some embodiments, storage subsystem 306 can store one or more applications and/or operating system programs to be executed by processing subsystem 302, including programs to implement some or all operations described above that would be performed using a computer. For example, storage subsystem 306 can store one or more code modules for implementing one or more method steps described herein.

A firmware and/or software implementation may be implemented with modules (e.g., procedures, functions, and so on). A machine-readable medium tangibly embodying instructions may be used in implementing methodologies described herein. Code modules (e.g., instructions stored in memory) may be implemented within a processor or external to the processor. As used herein, the term "memory" refers to a type of long term, short term, volatile, nonvolatile, or other storage medium and is not to be limited to any particular type of memory or number of memories or type of media upon which memory is stored.

Moreover, the term "storage medium" or "storage device" may represent one or more memories for storing data, including read only memory (ROM), RAM, magnetic RAM, core memory, magnetic disk storage mediums, optical storage mediums, flash memory devices and/or other machine-readable mediums for storing information. The term "machine-readable medium" includes, but is not limited to, portable or fixed storage devices, optical storage devices, wireless channels, and/or various other storage mediums capable of storing instruction(s) and/or data.

Furthermore, embodiments may be implemented by hardware, software, scripting languages, firmware, middleware, microcode, hardware description languages, and/or any combination thereof. When implemented in software, firmware, middleware, scripting language, and/or microcode, program code or code segments to perform tasks may be stored in a machine-readable medium such as a storage medium. A code segment (e.g., code module) or machine-executable instruction may represent a procedure, a function, a subprogram, a program, a routine, a subroutine, a module, a software package, a script, a class, or a combination of instructions, data structures, and/or program statements. A code segment may be coupled to another code segment or a hardware circuit by passing and/or receiving information, data, arguments, parameters, and/or memory contents. Information, arguments, parameters, data, etc. may be passed, forwarded, or transmitted by suitable means including memory sharing, message passing, token passing, network transmission, etc. These descriptions of software, firmware, storage mediums, etc., apply to systems 200 and 300, as well as any other implementations within the wide purview of the present disclosure. In some embodiments, aspects of the invention (e.g., surface classification) may be performed by software stored in storage subsystem 306, stored in memory 220 of a computer peripheral device, or both. One of ordinary skill in the art with the benefit of this disclosure would appreciate the many modifications, variations, and alternative embodiments thereof.

Implementation of the techniques, blocks, steps and means described throughout the present disclosure may be done in various ways. For example, these techniques, blocks, steps and means may be implemented in hardware, software, or a combination thereof. For a hardware implementation, the processing units may be implemented within one or more ASICs, DSPs, DSPDs, PLDs, FPGAs, processors, controllers, micro-controllers, microprocessors, other electronic units designed to perform the functions described above, and/or a combination thereof.

Each code module may comprise sets of instructions (codes) embodied on a computer-readable medium that directs a processor of a host computing device 110 to perform corresponding actions. The instructions may be configured to run in sequential order, in parallel (such as under different processing threads), or in a combination thereof. After loading a code module on a general-purpose computer system, the general-purpose computer is transformed into a special purpose computer system.

Computer programs incorporating various features described herein (e.g., in one or more code modules) may be encoded and stored on various computer readable storage media. Computer readable media encoded with the program code may be packaged with a compatible electronic device, or the program code may be provided separately from electronic devices (e.g., via Internet download or as a separately packaged computer readable storage medium).

Storage subsystem 306 can also store information useful for establishing network connections using the communication interface 312.

Computer system 300 may include user interface input devices 314 elements (e.g., touch pad, touch screen, scroll wheel, click wheel, dial, button, switch, keypad, microphone, etc.), as well as user interface output devices 316 (e.g., video screen, indicator lights, speakers, headphone jacks, virtual- or augmented-reality display, etc.), together with supporting electronics (e.g., digital to analog or analog to digital converters, signal processors, etc.). A user can operate input devices of user interface 314 to invoke the functionality of computing device 300 and can view and/or hear output from computing device 300 via output devices of user interface 316.

Processing subsystem 302 can be implemented as one or more processors (e.g., integrated circuits, one or more single core or multi core microprocessors, microcontrollers, central processing unit, graphics processing unit, etc.). In operation, processing subsystem 302 can control the operation of computing device 300. In some embodiments, processing subsystem 302 can execute a variety of programs in response to program code and can maintain multiple concurrently executing programs or processes. At a given time, some or all of a program code to be executed can reside in processing subsystem 302 and/or in storage media, such as storage subsystem 304. Through programming, processing subsystem 302 can provide various functionality for computing device 300. Processing subsystem 302 can also execute other programs to control other functions of computing device 300, including programs that may be stored in storage subsystem 304.

Communication interface (also referred to as network interface) 312 can provide voice and/or data communication capability for computing device 300. In some embodiments, communication interface 312 can include radio frequency (RF) transceiver components for accessing wireless data networks (e.g., Wi-Fi network; 3G, 4G/LTE, 5G; etc.), mobile communication technologies, components for short range wireless communication (e.g., using Bluetooth communication standards, NFC, etc.), other components, or combinations of technologies. In some embodiments, communication interface 312 can provide wired connectivity (e.g., universal serial bus (USB), Ethernet, universal asynchronous receiver/transmitter, etc.) in addition to, or in lieu of, a wireless interface. Communication interface 312 can be implemented using a combination of hardware (e.g., driver circuits, antennas, modulators/demodulators, encoders/decoders, and other analog and/or digital signal processing circuits) and software components. In some embodiments, communication interface 312 can support multiple communication channels concurrently.

User interface input devices 314 may include any suitable computer peripheral device (e.g., computer mouse, keyboard, gaming controller, remote control, stylus device, etc.), as would be appreciated by one of ordinary skill in the art with the benefit of this disclosure. User interface output devices 316 can include display devices (e.g., a monitor, television, projection device, etc.), audio devices (e.g., speakers, microphones), haptic devices, etc. Note that user interface input and output devices are shown to be a part of system 300 as an integrated system. In some cases, such as in laptop computers, this may be the case as keyboards and input elements as well as a display and output elements are integrated on the same host computing device. In some cases, the input and output devices may be separate from system 300, as shown in FIG. 1. One of ordinary skill in the art with the benefit of this disclosure would appreciate the many modifications, variations, and alternative embodiments thereof.

It will be appreciated that computing device 300 is illustrative and that variations and modifications are possible. A host computing device can have various functionality not specifically described (e.g., voice communication via cellular telephone networks) and can include components appropriate to such functionality. While the computing device 300 is described with reference to particular blocks, it is to be understood that these blocks are defined for convenience of description and are not intended to imply a particular physical arrangement of component parts. For example, processing subsystem 302, storage subsystem 306, user interfaces 314, 316, and communications interface 312 can be in one device or distributed among multiple devices. Further, the blocks need not correspond to physically distinct components. Blocks can be configured to perform various operations, e.g., by programming a processor or providing appropriate control circuitry, and various blocks might or might not be reconfigurable depending on how an initial configuration is obtained. Embodiments of the present invention can be realized in a variety of apparatus including electronic devices implemented using a combination of circuitry and software. Host computing devices or even peripheral devices described herein can be implemented using system 300.

Figure 4:
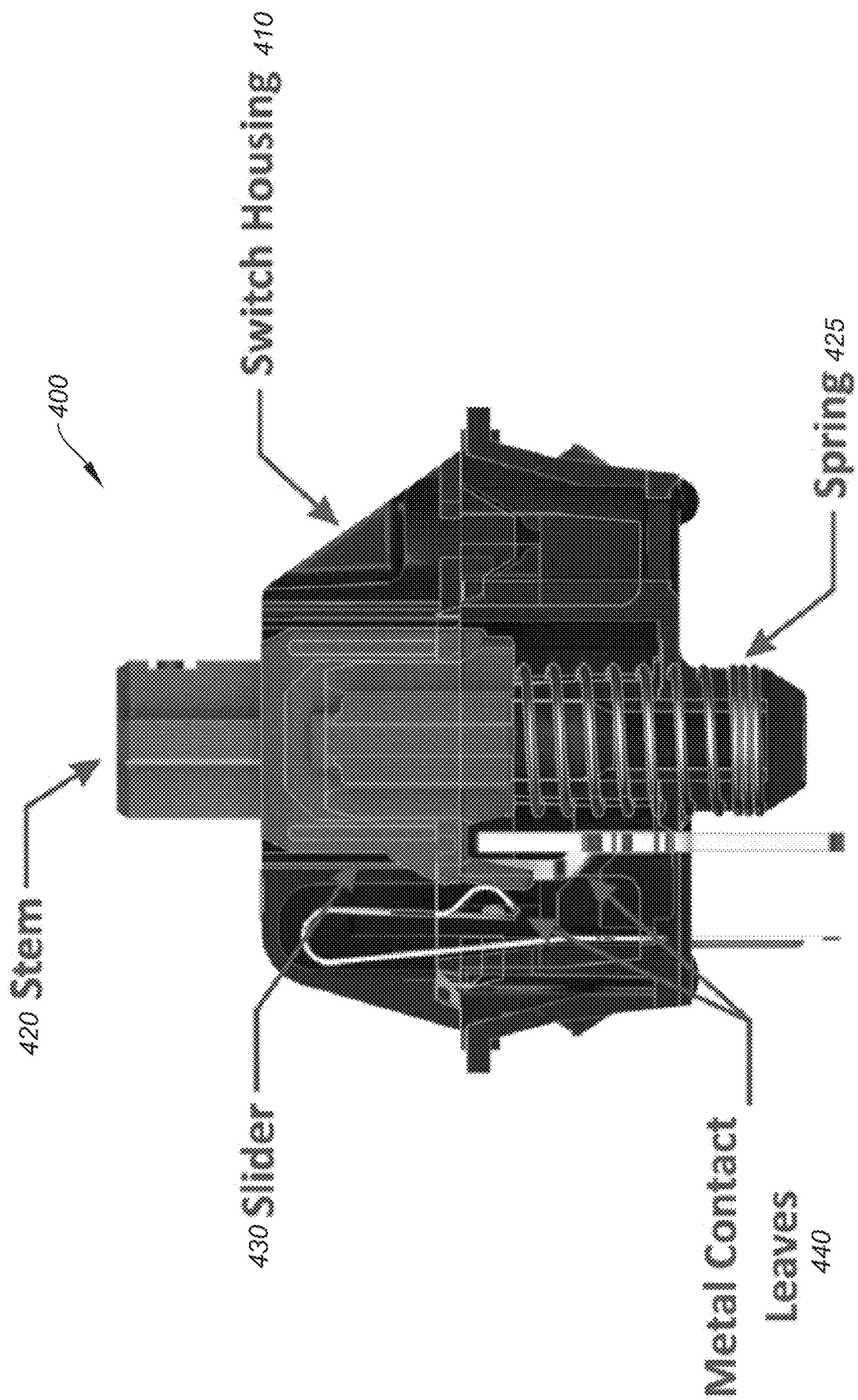
FIG. 4 shows a simplified contact-based key structure, according to certain embodiments.

FIG. 4 shows a simplified contact-based key structure 400, according to certain embodiments. Key structure 400 is a mechanical type of key structure found on many conventional keyboard devices. Key structure can include a switch housing 410, a stem 420 configured to be depressed in a linear downward motion within switch housing 410, and a spring 425 (e.g., torsion, leaf, coiled) that provides a resistance to a user key press on a key cap that is coupled to stem 420 and can further contribute to the overall feedback profile of the key structure. The key structure can further include a slider 430 that can move up and down as stem 420 is pressed, which can have a material affect over the type of feedback profile the key structure provides due to certain bumps, contours, or other structures that interact with the slider and/or the metal contact leaves 440, such as linear, tactile, clicky, or the like, as well as other key structure characteristics that affect a required actuation force, actuation distance, and travel distance, as would be appreciated by one of ordinary skill in the art with the benefit of this disclosure. Metal contact leaves 440 come into contact with each other when stem 420 is pressed a threshold distance causing them to complete an electrical circuit and generate a signal corresponding to a key press event.

Figure 5:
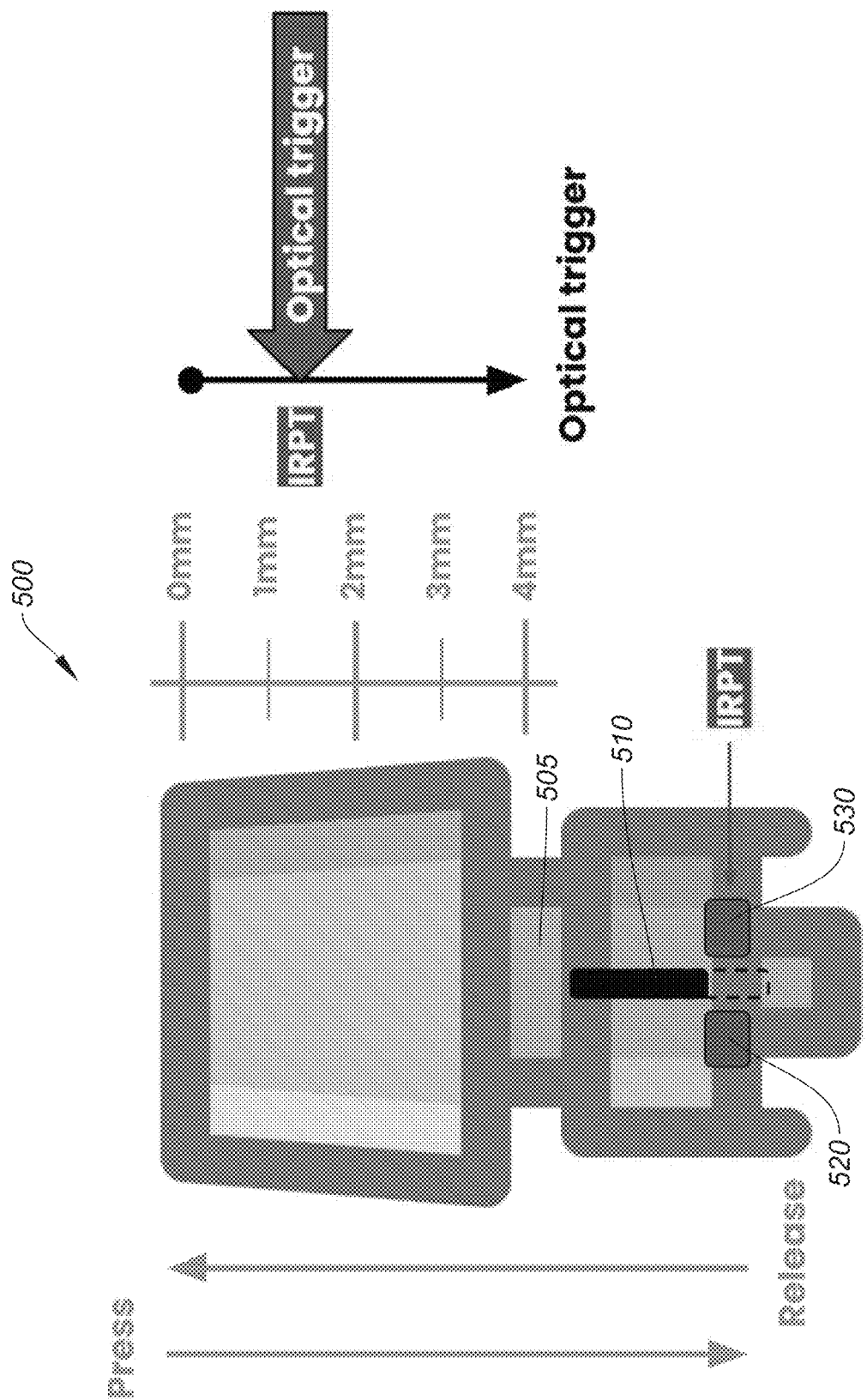
FIG. 5 shows a simplified contactless key structure with binary sensing, according to certain embodiments.

FIG. 5 shows a simplified contactless key structure with binary sensing, according to certain embodiments. Contactless switch typically does not have mechanically interfacing elements (no metal contacts) to trigger a key press during operation and can have a substantially longer operational life since there are no critical components subject to wear-and-tear. Thus, contactless switches can provide very clean signals to allow the input device to have a longer operational life. Some non-limiting examples of contactless switches include optical switches (described in embodiments herein), magnetic switches, inductive switches, capacitive switches, piezo switches, and the like. In addition, because contactless switches do not involve a physical contact between elements, no additional latency is needed to apply debouncing algorithms, and the like. Despite these advantages, contactless switches (e.g., optical switches) can consume significantly more current than a contact-based switch as they have to be actively "checked" periodically to confirm whether the switch is open or closed.

FIG. 5 shows an example of an operation of an optical switch 500 with a default-open configuration, according to certain embodiments. Optical switch 500 can include a stem 505, emitter 520, a receiver 530, and a barrier 510 that is typically directly or indirectly coupled to an actuator to move up and down in correspondence with the movements of the stem and key cap. As shown in FIG. 5, the key cap and stem can move up and down over a range of approximately 4 mm, although other ranges are possible. Barrier 510 can also be referred to as a "shutter." Typically, barrier 510 can move between a first position that does not obstruct a line-of-sight between emitter 520 and receiver 530 and a second position that obstructs the line-of-sight. Barrier 510 may provide an analog-like operation by allowing a user to adjust a position of barrier 510 by modulating an amount of obstruction that can range from complete obstruction, to some obstruction (as described below with respect to FIG. 6), to no obstruction. In operation, emitter 520 typically includes a light emitting diode (LED) that is pulsed (e.g., 20-50 μs) with an LED current (e.g., 5-6 mA) and a fixed frequency (e.g., 1 ms), although other pulse lengths and current values are possible. The light is projected from emitter 520 towards receiver 530, which can be a phototransistor (e.g., infra-red photo transistor) or other type of light-sensing element. The amount of current generated by receiver 530 can correspond to an amount of light 525 received from emitter 520. Unlike contact-based switches, which typically have a binary output including an "on" (closed circuit) or "off" (open circuit) operation, contactless switches may allow no light, some light, or all light emitted from emitter 520 to reach receiver 530, thus allowing any number of intermediary settings and can allow a user to set an "on" condition to any suitable actuation threshold (e.g., corresponding output from receiver 530), which can correspond to how far a button or key needs to be pressed to instantiate a click. In FIG. 5, optical switch 500 is in a normally open configuration where the switch allows light 525 emitted from emitter 520 to reach receiver 530 unobstructed when the actuator that controls barrier 510 is not pressed, and blocks the light from emitter 520 when the actuator is depressed. The point where barrier 510 blocks the light (e.g., approximately 1.3 mm) may be an optical trigger point where a key press event may be triggered. Other trigger points are possible and may depend on aspects of the shape, length, position, or other feature of barrier 510 relative to emitter 520 and receiver 530. One of ordinary skill in the art with the benefit of this disclosure would appreciate the many modifications, variations, and alternative embodiments thereof.

Figure 6:
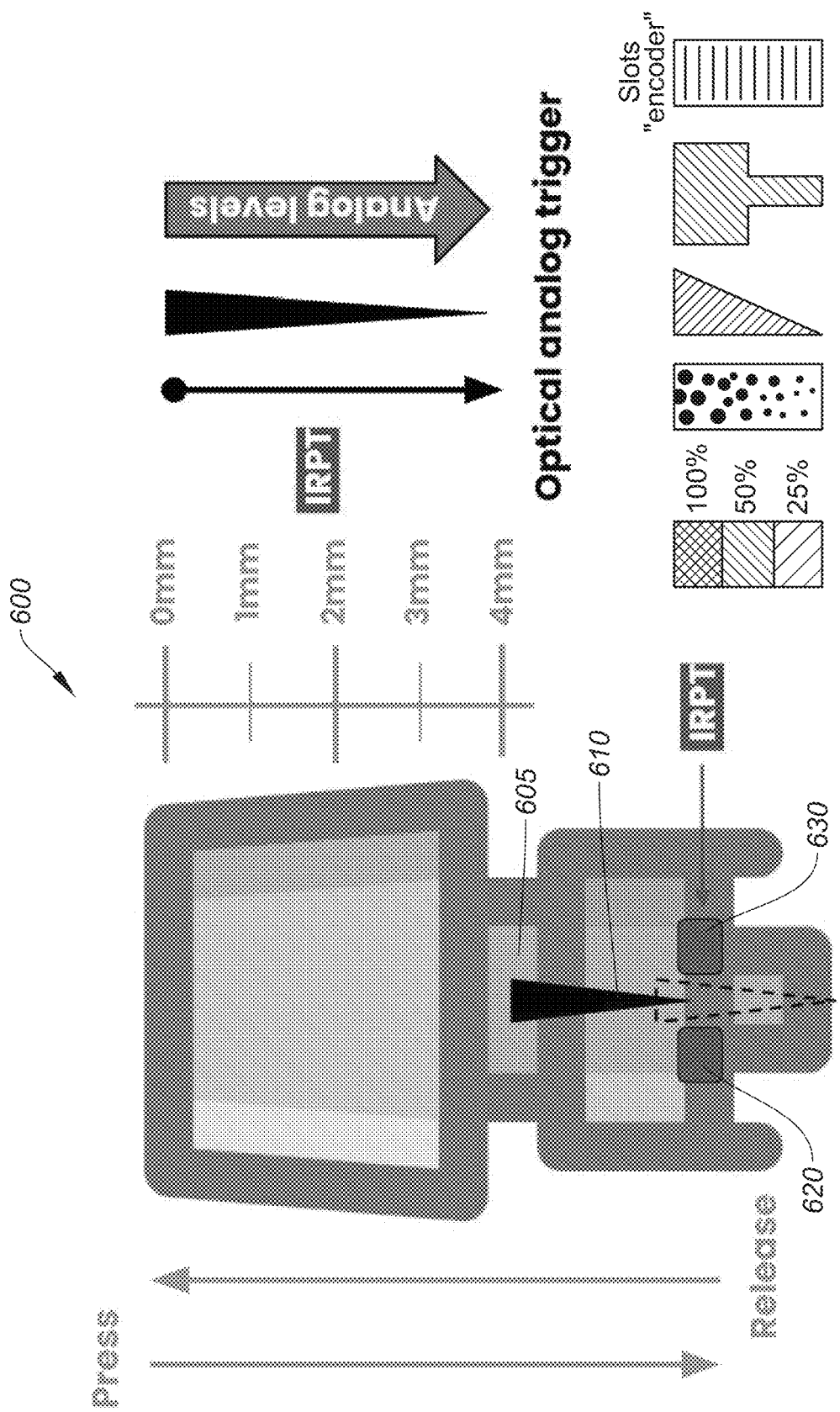
FIG. 6 shows a simplified contactless key structure with analog sensing, according to certain embodiments.

FIG. 6 shows a simplified contactless key structure 600 with analog sensing, according to certain embodiments. Key structure 600 can include an optical switch with a default-open configuration, and may include a stem 605, emitter 620, a receiver 630, and a barrier 610 that can be directly or indirectly coupled to an actuator and moves up and down in correspondence with movements of the stem and key cap over an operating range. The range of operation is shown to be approximately 4 mm, although other ranges are possible.

Key structure 600 can perform analog sensing due, in part, to the type of barrier used to block or impede the signal (e.g. IR light) from emitter 620 from reaching receiver 630 (e.g., infra-red photo transistor). Rather than completely blocking the emitter signal when the barrier reaches a certain position (with a binary on/off operation), barrier 610 partially blocks the signal at an increasing amount as stem 605 is depressed further along the operating range, such that most of the signal (e.g., 90%-99%) passes when barrier 610 initially blocks the signal, approximately half of the signal (e.g., 40%-60%) passes when the stem is depressed about half way, and very little signal (e.g., 0-5%) passes when the stem is fully depressed. The signal-to-stem displacement can be linear as discussed, or nonlinear in some embodiments. Different amounts of signal and ranges can be used, and embodiments may be applied to normally-open or normally-closed optical switch configurations, as would be appreciated by one of ordinary skill in the art with the benefit of this disclosure.

The amount of signal (e.g., IR light) can be detected (e.g., sampled) at any location that the stem and corresponding barrier is positioned, thus many positions along the range of operation can be detected via this analog-type sensing, as opposed to the limited binary-type configurations, such as embodiments like optical switch 500. Typically, the sample rate of the keys follows keyboard requirements (e.g., match USB high speed report rate spec). For gaming, sampling rates typically range from 1 kHz and up (e.g., 2 kHz, 4 kHz, 8 kHz). In some cases, a typical targeted resolution is 0.1 mm or lower, which can translate to approximately 40 levels for a switch travel of 0-4 mm. In some cases, the lower the resolution is, the better and a limiting factor can be the measurement noise of your sensing design signal-to-noise ratio.

Barrier 610 can be any suitable shape that allows gradually less signal (e.g., in normally open embodiments) or gradually more signal (e.g., in normally closed embodiments) as the stem is depressed. For instance, barrier 610 can be wedge-shaped, as shown, which gradually allows less signal to pass as the key is depressed farther along its range of operation (e.g., 0-4 mm). Barrier 610 may have other shapes, including rectangular with different sized apertures that allow a gradual increase or decrease of signal as the key is pressed, different wedge shapes, t-shapes, slot sizes, or the like, as shown in FIG. 6. One of ordinary skill in the art with the benefit of this disclosure would appreciate the many modifications, variations, and alternative embodiments thereof.

Figure 7:
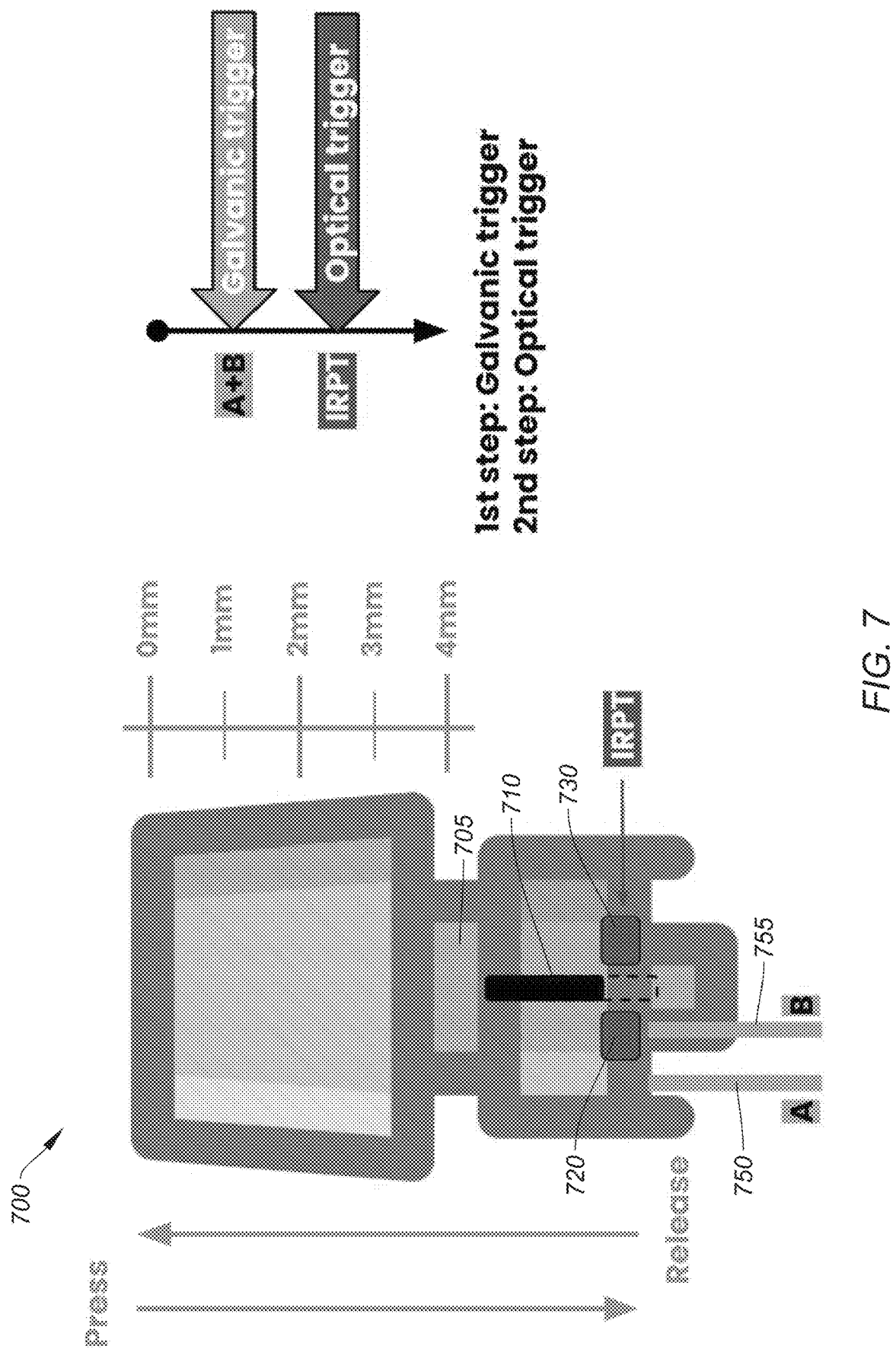
FIG. 7 shows a hybrid key structure with binary sensing, according to certain embodiments.

FIG. 7 shows a hybrid key structure 700 with binary sensing, according to certain embodiments. Hybrid key structure 700 can include both a contact-based switch (e.g., galvanic switch) and a contactless switch (e.g., optical switch). In some cases, optical sensing may consume significant amounts of power when configured to continuously scan the operational state (e.g., on or off) of the optical switch at a suitable sample rate (e.g., 1 kHz) to ensure a fast response time to key presses and good performance characteristics. This is especially true for keyboards with many keys (e.g., 104 keys), so reducing the power requirement can be advantageous and often necessary, particularly for battery operated devices with limited power resources. Thus, hybrid key structure 700 can mitigate this problem by using a contact-based switch to turn on and off a corresponding contactless switch. For example, a contact-based switch can be used to turn on the contactless switch when the key is pressed a first threshold amount (e.g., 1 mm). The contactless switch can then sample its binary operational state (e.g., on or off) at a suitable sample rate and register a key press when the contactless switch is pressed a second threshold amount (e.g., 2.5 mm).

Referring back to FIG. 7, hybrid key structure 700 can include a contact-based switch with metal contact leaves 750 and 755 that make electrical contact with each other and generating a first signal when stem 705 is pressed a threshold amount (e.g., 1 mm). The first signal may cause the contactless switch to begin sampling its operational state at a suitable sample rate. The contactless switch may include an emitter 720, a receiver 730, and a barrier 710 that can be directly or indirectly coupled to an actuator and moves up and down in correspondence with movements of the stem 705 and key cap over an operating range. The contactless key switch may detect a keypress and generate a second signal when barrier 810 blocks the signal (e.g., IR light) from emitter 720 from reaching receiver 730 (IRPT), which is shown to be when the key is pressed approximately 2.5 mm, although other thresholds are possible. The contactless switch operates in a binary fashion where a blocked signal is interpreted as a key press, and an unblocked signal is interpreted as an unpressed key. When the key is released and the contact-based switch breaks contact (e.g., above 1 mm), the contactless switch can be turned off, thereby conserving power by only utilizing the contactless switch when a key press is made.

Figure 8:
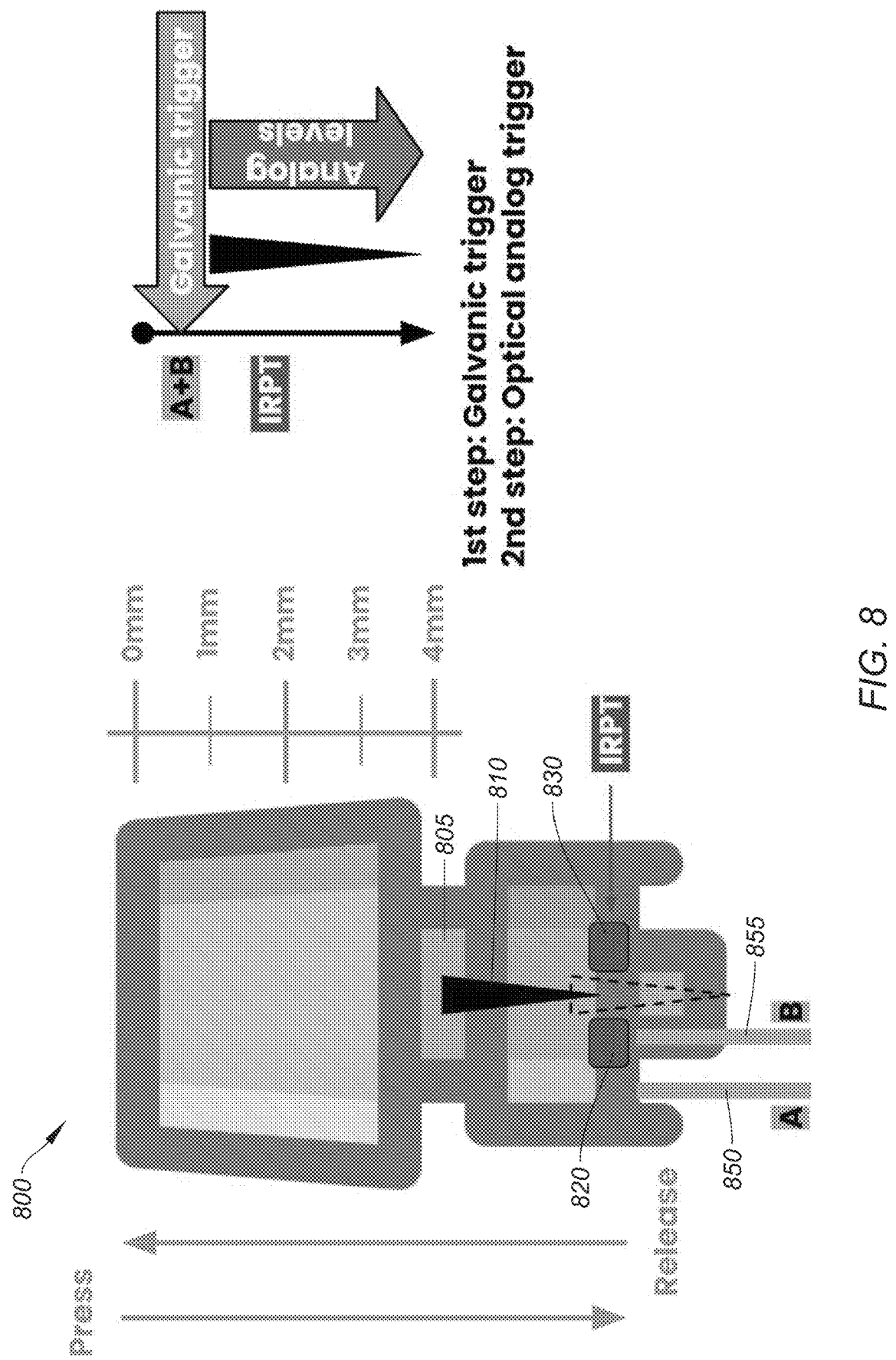
FIG. 8 shows a hybrid key structure with analog sensing, according to certain embodiments.

FIG. 8 shows a hybrid key structure 800 with analog sensing, according to certain embodiments. Hybrid key structure 800 benefits from the precision afforded by analog sensing with a significantly reduced power requirement. In some embodiments, this can be achieved by using a contact-based switch (e.g., galvanic contacts) to control the operation of a contactless switch (e.g., optical, inductive, magnetic, etc.), similar to key switch 700, but the contactless switch being configured for analog operation. For example, when a key is pressed, metal contact leaves 850, 855 make contact and analog detection on the contactless switch commences. After releasing the key (e.g., when metal contact leaves 850, 855 break contact, the analog function of the contactless switch turns off (e.g., within 1 μs) to conserve power.

Unlike hybrid key structure 700, analog detection should be available over much of the range of operation of the key (e.g., 4 mm), as opposed to a single threshold to determine when a key press is instantiated. To achieve this, the contact-based switch should make (galvanic) contact at a first threshold early in the range of operation to ensure that: (1) the analog detection range is available over much of the throw of the key; and (2) the threshold is set to avoid or minimize false positive key press detection events. In some cases, galvanic contact can be configured for <1 mm (e.g., 0.1 mm-1 mm) for a key with a range of operation of 4 mm to initiate analog sensing for 3 mm of travel or more. Embodiments that make galvanic contact farther along the range of operation (e.g., >1 mm) may lose key press resolution at the top portion of the range.

When galvanic contact is made, the system can start sampling the contactless key switch at a suitable sample rate until galvanic contact is broken, or until the analog part senses a key position at 0 mm or very close to that (e.g., within 0.05 mm). The sampling rate may remain constant while the contactless switch is activated by the galvanic contact. In some cases, the sampling rate may differ based on the position of the key along the range of operation. For example, if the key is depressed around 1 mm or less for a threshold time and galvanic contact is made, the sampling rate may be reduced (e.g., 20%-80%). This may be a useful feature for users that tend to rest their fingers on keys a bit heavy without intending to instantiate a key press. In such cases, a key hovering at or near the point of galvanic contact for a longer period of time (e.g., 1 s, 5 s, etc.) may trigger operation of the contactless key switch(es), but less power can be consumed until the key is moved farther down along the range of operation, which may cause the sample to return to 100% normal sampling rate. In some embodiments, the sampling rate may be different for different keys or groups of keys based on usage. For example, "WASD" keys may be sampled at a first rate during analog operation, while less used keys such as function keys or number keys may be sampled at a lower sample rate. Multiple sample rates may be set for analog measurement for any suitable purpose, as would be appreciated by one of ordinary skill in the art with the benefit of this disclosure.

As noted above, analog sensing is often a power hungry task, which can be challenging to manage for battery operated devices. For a given analog scanning technology (e.g., optical, magnetic, or others), a goal (according to certain embodiments, to lower the power consumption for battery operated devices is to put the analog sensing part in a low power state (e.g., sleep mode) as long as possible. In some cases, a first duty-cycle at play is the key scan rate. For example, if an analog scanning technology ("scan sensor" or "sensor") needs 20 µs to get a sample of the key position, and the spec requirement is to sample the key at 8 kHz (125 µs), then after the 20 µs, the scan sensor can sleep for the next 105 µs. In this case, the sample rate duty cycle would be 16%. If the sample rate is slower, such as 1 kHz, the sample rate duty cycle would be lower at 2%, such that the scan sensor has a longer sleep time and a lower power consumption requirement. Thus, the scan rate (also referred to as a sample rate or update rate) is one parameter to control that affects the power consumption. A higher scan rate will yield a lower latency, but at the cost of higher power consumption. Therefore, on less used keys, lowering the sample rate is an effective way to reduce power consumption, while still maintaining a high scan rate for the most-used keys (e.g., WASD for gamers) for the performance benefits, such as lower latency. Additionally, certain embodiments may also put the scan sensor in a low power mode of operation when the key is not active (e.g., not experiencing typing activity for a threshold time, e.g., 1 s, 5 s, etc.). After the scan sensor is switched from a low power mode to a high power mode (e.g., sleep mode to active mode) by the galvanic contact, then the key can be sampled by the analog part as described above, with a given update rate. Once released, the key can sleep and does not need to be checked (sampled) by the power hungry analog sensor. This operational scheme can significantly reduce the overall power consumption of the keyboard.

In some cases, a user may be able to configure the threshold where analog detection occurs. Some users may prefer sensitive keys, while others may prefer a longer throw before activation. An analog key provides the possibility to fully adjust the threshold that each key activates. One of the challenges making an analog key hybrid is to have the galvanic contact triggering early (e.g., some may prefer near 0.1 mm, which is highly very sensitive). A false trigger of the galvanic contact (which can happen if a user simply rests her fingers on the keys too hard) is not a significant problem if it does not occur too frequently since the key will be registered with the analog sensor in the second step. However, a very high galvanic trigger point can be a consequent mechanical design challenge. In practical applications, a design target may be more like 0.3 mm for the galvanic trigger point. If a user still prefers the activation threshold to be <0.3 mm, in some embodiments the galvanic contact may trigger too late (or never if not pressed enough). In such cases, one solution is to disable the hybrid strategy and continuously scan the specific key using analog sensing only. Setting hybrid or non-hybrid operation may differ by design and would be appreciated by one of ordinary skill in the art with the benefit of this disclosure.

By way of example, some embodiments of hybrid key structures with analog detection can include a keyboard key structure comprising a key stem; a contact-based mechanical trigger (e.g., galvanic key switch, metal contact leaves, or any structure configured to make electrical contact, etc.); and a contactless analog key switch, wherein the key stem is configured to be depressed and move along a linear path over a range of operation, wherein the contact-based mechanical trigger is configured to activate after the key stem is depressed a threshold distance in the range of operation, and wherein in response to the contact-based mechanical trigger activating, the contactless analog key switch is configured to detect, at a sample rate, a position of the key stem between the threshold distance and an end of the range of operation. The maximum range of operation of the key stem may be between 3-6 mm, although other ranges small and larger are possible. The threshold distance that activates the contact-based mechanical trigger can be between 0-1 mm or other suitable range. The contactless analog key switch can be an optical analog key switch, a magnetic analog key switch, an inductive analog key switch, or other suitable contactless switch. In some embodiments, the sample rate is a first sample rate, wherein the contactless analog key switch is configured to detect the position of the key stem at a second sample rate at a second threshold distance, the second threshold distance is between the threshold distance and the end of the range of operation, and the second sample rate is faster than the first sample rate. In certain embodiments, when the detected position of the key stem is at or below the threshold distance and above the second threshold distance for a threshold time, the keyboard key structure stops detecting the position of the key stem. In some embodiments, the second threshold distance is user programmable, and when the second threshold distance is programmed to be within 1 mm of the threshold distance, the contactless analog key switch operates independent of and not in response to the contact-based mechanical trigger activating. In some cases, the contact-based mechanical trigger provides a haptic feedback when the threshold distance is reached independent of the operation of the contactless analog key switch. In some embodiments, when the detected position of the key stem is above the threshold distance, the keyboard key structure stops detecting the position of the key stem.

Figure 9:
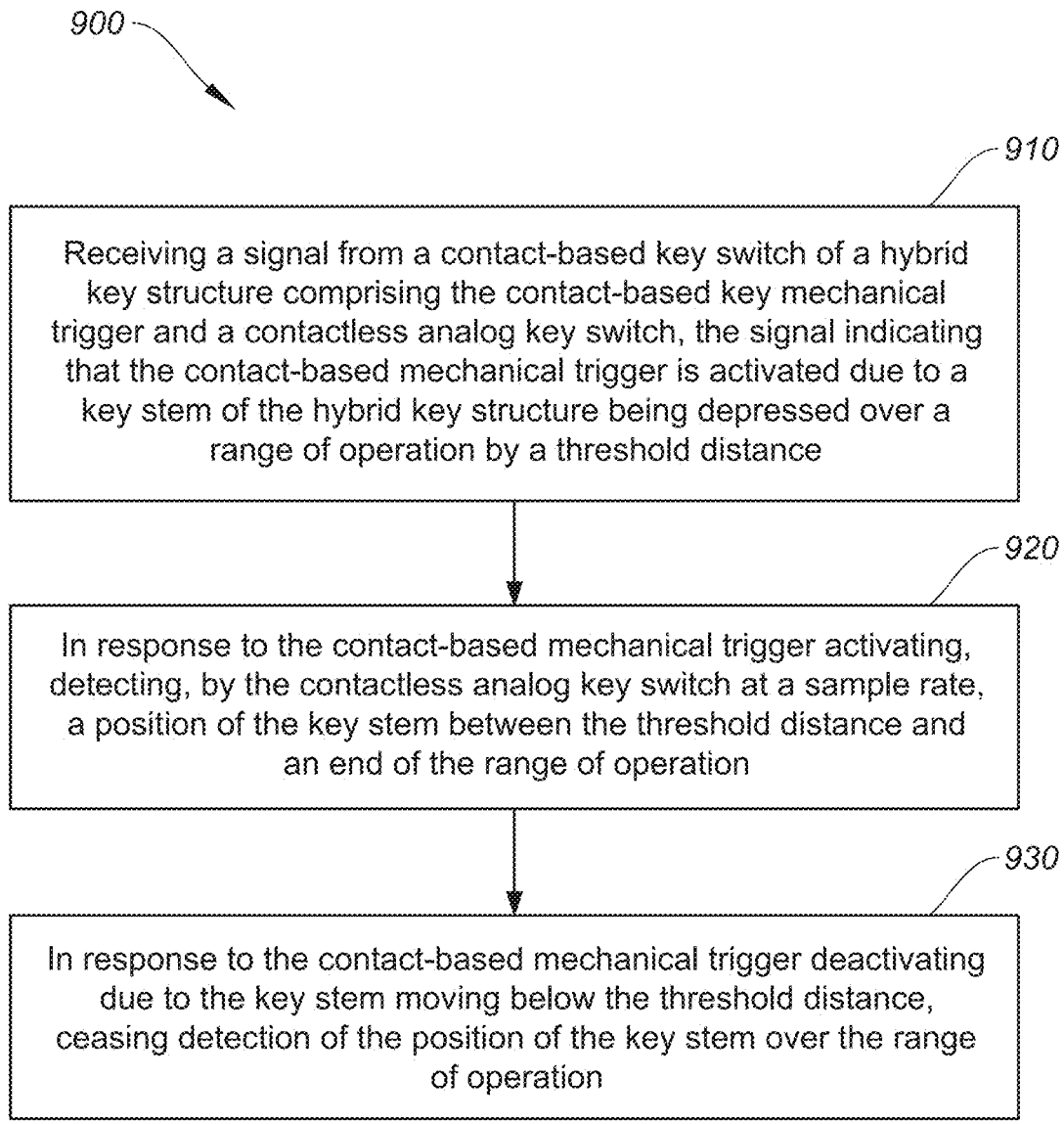
FIG. 9 is a simplified flow chart showing a method of operating a hybrid analog key structure, according to certain embodiments.

FIG. 9 is a simplified flow chart showing aspects of a method 900 for operating a keyboard with one or more hybrid key structures with analog detection, according to certain embodiments. Method 900 can be performed by processing logic that may comprise hardware (circuitry, dedicated logic, etc.), software operating on appropriate hardware (such as a general purpose computing system or a dedicated machine), firmware (embedded software), or any combination thereof. In certain embodiments, method 900 can be performed by aspects of system 200, 300, or a combination thereof, as would be appreciated by one of ordinary skill in the art with the benefit of this disclosure.

At operation 910, method 900 can include receiving a signal from a contact-based key switch of a hybrid key structure comprising the contact-based key mechanical trigger and a contactless analog key switch, the signal indicating that the contact-based mechanical trigger is activated due to a key stem of the hybrid key structure being depressed over a range of operation by a threshold distance, according to certain embodiments.

At operation 920, in response to the contact-based mechanical trigger activating, method 900 can include detecting, by the contactless analog key switch at a sample rate, a position of the key stem between the threshold distance and an end of the range of operation, according to certain embodiments.

At operation 930, in response to the contact-based mechanical trigger deactivating due to the key stem moving below the threshold distance, method 900 can include ceasing detection of the position of the key stem over the range of operation, according to certain embodiments.

In some cases, a maximum range of operation of the key stem is between 3-6 mm, and the threshold distance that activates the contact-based mechanical trigger is between 0-1 mm, although other ranges of operation and thresholds can be used. In some aspects, the contact-based mechanical trigger is a galvanic-type key switch, a leaf spring contact, a single metal spring contact that electrically shorts two pads on the PCB, or other suitable implementation, as would be appreciated by one of ordinary skill in the art with the benefit of this disclosure. The contactless analog key switch can be an optical analog key switch, a magnetic analog key switch, an inductive analog key switch, or other suitable key switch type that is capable of analog detection, as would be appreciated by one of ordinary skill in the art with the benefit of this disclosure. In embodiments with an optical analog key switch, some may include a phototransistor, a light emitting element operable to direct light towards the phototransistor in response to the activation of the contact-based mechanical trigger, and a blocking device coupled to the key stem configured to move along the linear path with the key stem and control an amount of light that reaches the phototransistor from the light emitting element based on a position of the blocking device in the range of operation. The optical analog key switch may detect the position of the key stem based on the controlled amount of light that reaches the phototransistor. A magnetic analog key switch can include a Hall effect sensor or TMR sensor, both sensors sensitive to the magnetic field and can provide an analog output or digital reading of the magnetic field strength. In some aspects, the sensor can be located on the PCB (e.g., top or bottom side, under the key), and can sense the position of a magnet located in the key stem. As the magnet gets closer to the sensor, it will induce a bigger field strength that the sensor can measure. In such cases, the magnetic field strength can now a correlation with the key position, though some embodiments may have non-linear proportions that may need calibration and/or compensation adjustments for accuracy. In certain embodiments, an inductive analog key switch can include a conductive target coupled to the key stem and configured to move with the key stem along the linear path over at least a portion of the range of operation, and one or more inductive coils configured to detect the conductive target and generate a corresponding signal, wherein the inductive analog key switch detects the position of the key stem based on a strength of the corresponding signal.

In further embodiments, the sample rate can be a first sample rate, where the contactless analog key switch is configured to detect the position of the key stem at a second sample rate at a second threshold distance, the second threshold distance is between the threshold distance and the end of the range of operation, and the second sample rate is faster than the first sample rate. In some embodiments, the second threshold distance is user programmable, and when the second threshold distance is programmed to be within 1 mm of the threshold distance (or other suitable distance), the contactless analog key switch operates independent of and not in response to the contact-based mechanical trigger activating.

It should be appreciated that the specific steps illustrated in FIG. 9 provide a particular method 900 for operating a keyboard with one or more hybrid key structures with analog detection, according to certain embodiments. Other sequences of steps may also be performed according to alternative embodiments. Furthermore, additional steps may be added or removed depending on the particular application. Any combination of changes can be used and one of ordinary skill in the art with the benefit of this disclosure would understand the many variations, modifications, and alternative embodiments thereof.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local area network, a wide-area network, a virtual private network, the Internet, an intranet, an extranet, a public switched telephone network, an infrared network, a wireless network, and any combination thereof.

In embodiments utilizing a network server as the operation server or the security server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language, including but not limited to Java®, C, C # or C++, or any scripting language, such as Perl, Python or TCL, as well as combinations thereof. The server(s) may also include database servers, including without limitation those commercially available from Oracle®, Microsoft®, Sybase®. and IBM®.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. For example, customized hardware might also be used and/or particular elements might be implemented in hardware, software (including portable software, such as applets) or both. Further, connections to other computing devices such as network input/output devices may be employed.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter. The various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multi-purpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another or may be combined in various ways. All possible combinations and sub-combinations are intended to fall within the scope of the present disclosure. In addition, certain method or process blocks may be omitted in some embodiments. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

What is claimed is:

1. A keyboard key structure comprising:
a key stem;
a contact-based mechanical trigger; and
a contactless analog key switch,
wherein the key stem is configured to be depressed and move along a linear path over a range of operation,
wherein the contact-based mechanical trigger is configured to activate after the key stem is depressed a threshold distance in the range of operation, and
wherein in response to the contact-based mechanical trigger activating, the contactless analog key switch is configured to detect, at a sample rate, a position of the key stem between the threshold distance and an end of the range of operation.

2. The keyboard key structure of claim 1 wherein a maximum range of operation of the key stem is between 3-6 mm, and
wherein the threshold distance that activates the contact-based mechanical trigger is between 0-1 mm.

3. The keyboard key structure of claim 1 wherein the contact-based mechanical trigger is a galvanic-type key switch.

4. The keyboard key structure of claim 1 wherein the contactless analog key switch is one of:
an optical analog key switch;
a magnetic analog key switch; or
an inductive analog key switch.

5. The keyboard key structure of claim 4 wherein the optical analog key switch includes:
a phototransistor;
a light emitting element operable to direct light towards the phototransistor in response to the activation of the contact-based mechanical trigger; and
a blocking device coupled to the key stem configured to:
move along the linear path with the key stem; and
control an amount of light that reaches the phototransistor from the light emitting element based on a position of the blocking device in the range of operation,
wherein the optical analog key switch detects the position of the key stem based on the controlled amount of light that reaches the phototransistor.

6. The keyboard key structure of claim 4 wherein the inductive analog key switch includes:
a conductive target coupled to the key stem and configured to move with the key stem along the linear path over at least a portion of the range of operation;
one or more inductive coils configured to detect the conductive target and generate a corresponding signal,
wherein the inductive analog key switch detects the position of the key stem based on a strength of the corresponding signal.

7. The keyboard key structure of claim 1 wherein the sample rate is a first sample rate,
wherein the contactless analog key switch is configured to detect the position of the key stem at a second sample rate at a second threshold distance,
wherein the second threshold distance is between the threshold distance and the end of the range of operation, and
wherein the second sample rate is faster than the first sample rate.

8. The keyboard key structure of claim 7 wherein when the detected position of the key stem is at or below the threshold distance and above the second threshold distance for a threshold time, the keyboard key structure stops detecting the position of the key stem.

9. The keyboard key structure of claim 7 wherein the second threshold distance is user programmable, and wherein when the second threshold distance is programmed to be within 1 mm of the threshold distance, the contactless analog key switch operates independent of and not in response to the contact-based mechanical trigger activating.

10. The keyboard key structure of claim 9 wherein the contact-based mechanical trigger provides a haptic feedback when the threshold distance is reached independent of the operation of the contactless analog key switch.

11. The keyboard key structure of claim 1 wherein when the detected position of the key stem is above the threshold distance, the keyboard key structure stops detecting the position of the key stem.

12. A method of operating a keyboard, the method comprising:
receiving a signal from a contact-based mechanical trigger of a hybrid key structure comprising the contact-based key mechanical trigger and a contactless analog key switch, the signal indicating that the contact-based mechanical trigger is activated due to a key stem of the hybrid key structure being depressed over a range of operation by a threshold distance;
in response to the contact-based mechanical trigger activating, detecting, by the contactless analog key switch at a sample rate, a position of the key stem between the threshold distance and an end of the range of operation; and
in response to the contact-based mechanical trigger deactivating due to the key stem moving below the threshold distance, ceasing detection of the position of the key stem over the range of operation.

13. The method of claim 12 wherein a maximum range of operation of the key stem is between 3-6 mm, and
wherein the threshold distance that activates the contact-based mechanical trigger is between 0-1 mm.

14. The method of claim 12 wherein the contact-based mechanical trigger is a galvanic-type key switch.

15. The method of claim 12 wherein the contactless analog key switch is one of:
an optical analog key switch;
a magnetic analog key switch; or
an inductive analog key switch.

16. The method of claim 15 wherein the optical analog key switch includes:
a phototransistor;
a light emitting element operable to direct light towards the phototransistor in response to the activation of the contact-based mechanical trigger; and
a blocking device coupled to the key stem configured to:
move along a linear path with the key stem; and
control an amount of light that reaches the phototransistor from the light emitting element based on a position of the blocking device in the range of operation,
wherein the optical analog key switch detects the position of the key stem based on the controlled amount of light that reaches the phototransistor.

17. The method of claim 15 wherein the inductive analog key switch includes:
a conductive target coupled to the key stem and configured to move with the key stem along a linear path over at least a portion of the range of operation; and
one or more inductive coils configured to detect the conductive target and generate a corresponding signal,
wherein the inductive analog key switch detects the position of the key stem based on a strength of the corresponding signal.

18. The method of claim 12 wherein the sample rate is a first sample rate,
wherein the contactless analog key switch is configured to detect the position of the key stem at a second sample rate at a second threshold distance,
wherein the second threshold distance is between the threshold distance and the end of the range of operation, and
wherein the second sample rate is faster than the first sample rate.

19. The method of claim 18 wherein the second threshold distance is user programmable, and wherein when the second threshold distance is programmed to be within 1 mm of the threshold distance, the contactless analog key switch operates independent of and not in response to the contact-based mechanical trigger activating.

20. A keyboard key structure comprising:
   a key stem;
   a contact-based key switch; and
   a contactless analog key switch,
   wherein the key stem is configured to be depressed,
   wherein the contact-based mechanical trigger is configured to activate first as the key stem is depressed, and
   wherein in response to the contact-based key switch activating, and after the key stem is depressed a further distance, the contactless analog key switch is activated and operable to detect, at a sample rate, a position of the key stem over a range of operation.

* * * * *